(12) United States Patent
Uy et al.

(10) Patent No.: US 10,537,034 B2
(45) Date of Patent: Jan. 14, 2020

(54) CONTROL BOXES PRINCIPALLY FOR USE WITH EQUIPMENT OF SWIMMING POOLS AND SPAS

(71) Applicant: Zodiac Pool Systems LLC, Vista, CA (US)

(72) Inventors: Dindo Uy, North Hollywood, CA (US); Mark Bauckman, San Marcos, CA (US); Hwa Heng, Vista, CA (US); Krishna Desai, Vista, CA (US); David Goldman, Carlsbad, CA (US)

(73) Assignee: Zodiac Pool Systems LLC, Carlsbad, CA (US)

(*) Notice: Subject to any disclaimer, the term of this patent is extended or adjusted under 35 U.S.C. 154(b) by 0 days.

(21) Appl. No.: 16/170,355

(22) Filed: Oct. 25, 2018

(65) Prior Publication Data

US 2019/0132972 A1     May 2, 2019

Related U.S. Application Data

(60) Provisional application No. 62/580,221, filed on Nov. 1, 2017.

(51) Int. Cl.
| | | |
|---|---|---|
| *H05K 5/02* | (2006.01) | |
| *H02G 3/08* | (2006.01) | |
| *E04H 4/12* | (2006.01) | |
| *A61H 33/00* | (2006.01) | |
| *H04B 1/3827* | (2015.01) | |

(52) U.S. Cl.
CPC .......... *H05K 5/0217* (2013.01); *A61H 33/005* (2013.01); *E04H 4/12* (2013.01); *H02G 3/081* (2013.01); *A61H 2033/0058* (2013.01); *A61H 2201/5097* (2013.01); *H04B 1/3827* (2013.01)

(58) Field of Classification Search
CPC ................ H05K 5/0217; A61H 33/005; A61H 2033/0058; A61H 2201/5097; E04H 4/12; H02G 3/081; H04B 1/3827
See application file for complete search history.

(56) References Cited

U.S. PATENT DOCUMENTS

| | | | |
|---|---|---|---|
| 4,424,438 A | 1/1984 | Antelman et al. | |
| 8,785,771 B2* | 7/2014 | Dunkleberger | H04L 12/2829 174/50 |
| 9,568,208 B2* | 2/2017 | West | F24F 11/89 |
| 2005/0258809 A1 | 11/2005 | Karslo | |
| 2007/0154322 A1* | 7/2007 | Stiles, Jr. | F04D 27/004 417/44.1 |
| 2013/0194768 A1 | 8/2013 | Dunkleberger et al. | |

(Continued)

FOREIGN PATENT DOCUMENTS

WO     0014842     3/2000

OTHER PUBLICATIONS

International Application No. PCT/US2018/057496, International Search Report and Written Opinion dated Feb. 18, 2019, 14 pages.

*Primary Examiner* — Rockshana D Chowdhury
(74) *Attorney, Agent, or Firm* — Kilpatrick Townsend & Stockton LLP; Dean W. Russell

(57) ABSTRACT

Control boxes with segregated low- and high-voltage components are described. Service technicians (or others) requiring access to one set of components may do so without necessarily accessing the other set. Dual user interfaces may be utilized, further, with one interface being present at the control box and the other being remote therefrom.

4 Claims, 3 Drawing Sheets

(56) References Cited

U.S. PATENT DOCUMENTS

2015/0049750 A1 2/2015 Uy et al.
2015/0077955 A1* 3/2015 Tio ...................... H05K 7/1432
                                                    361/752

* cited by examiner

CONTROL BOXES PRINCIPALLY FOR USE WITH EQUIPMENT OF SWIMMING POOLS AND SPAS

CROSS-REFERENCE TO RELATED APPLICATION

This application claims the benefit of and priority to U.S. Provisional Patent Application Ser. No. 62/580,221, filed Nov. 1, 2017, and having the same title as appears above, the entire contents of which application are hereby incorporated herein by this reference.

FIELD OF THE INVENTION

This invention relates to control mechanisms for equipment and more particularly, but not necessarily exclusively, to control boxes providing central control of such equipment for swimming pools and spas.

BACKGROUND OF THE INVENTION

U.S. Patent Application Publication No. 2005/0258809 of Karslo, whose entire contents are incorporated herein by this reference, discloses control panels "that automate or manually operate various pool tasks, such as cleaning, filtration, heating, lighting, and other accessories." See Karslo, p. 1, ¶0002. An illustrated panel includes a door hinged to a hollow body which contains multiple manually-operable waterproof switches. See id., ¶0013; FIGS. 1-2. High voltage (240V and 120V) is present at the panel, with circuit protectors (breakers) available to limit the current draw to ten to sixteen amperes (10-16 A). Both these voltage and current values substantially exceed what is necessary to operate, for example, electronic logic components of the control system.

Control panels such as these, at which high voltage is present without segregation, typically may be serviced only by licensed electricians. Accordingly, service technicians lacking licensure may be precluded from accessing the panels. Of course, even for a licensed electrician, unneeded exposure to high voltages may create safety concerns.

Additionally absent from the control panels of the Karslo application are any transmitters and receivers or other means for communicating data to or from the panels. Consequently, the Karslo application does not contemplate remotely monitoring or controlling any operations of the control panels. Control panels of the Karslo application additionally are intended for permanent installation "remote from each of the individual pool devices," see id., ¶0012, which may inhibit obtaining real-time user information needed to operate the devices.

SUMMARY OF THE INVENTION

The present invention seeks to resolve these and other issues associated with conventional controllers of, principally, swimming pool and spa equipment. Boxes (sometimes called "power cans") consistent with the invention may segregate low-voltage components and wiring from high-voltage components and wiring, effectively forming two separate, segregated sub-panels. A service technician needing to work on low-voltage components or wiring hence need only access the low-voltage sub-panel, avoiding both any licensure requirement and any exposure to the high-voltage components and wiring. Conversely, a qualified servicer of the high-voltage components and wiring need access only the high-voltage sub-panel, thus reducing risk of accidentally damaging any otherwise-exposed low-voltage components and wiring through inadvertent contact with high voltage.

Versions of the present invention also may include dual user interfaces. One such interface may be present at the control box, while the other may be remote therefrom. In particular, the other user interface may be present on a portable device capable of transmitting and receiving information wirelessly. In presently-preferred embodiments of the invention, the portable device functions as a master, whereas the components of the (fixed-position) control box function as slaves, or servants, to the master. As a result, when information needs to be gathered or input remote from the control box (e.g., a chlorinator needs to be viewed for purposes of providing user input), the user may carry the portable device to the chlorinator, utilize the user interface of the portable device to supply the requisite input, and thereby cause the input to be transmitted to the control box for reception and processing.

Moreover, any or all of the wireless radios, Ethernet capabilities, and main logic of the system may reside on the master device. This direct communication avoids need for any secondary communication links, hence improving communications speeds. The master device additionally may be compatible with multiple wireless protocols (e.g. Zigbee, WiFi, Bluetooth, etc.), enhancing its overall range, accessibility, and speed, for example.

It thus is an optional, non-exclusive object of the present invention to provide control devices in which low-voltage and high-voltage components are segregated.

It is also an optional, non-exclusive object of the present invention to provide control devices in which access to some components may be obtained without accessing other components.

It is an additional optional, non-exclusive object of the present invention to provide control devices in the form of control boxes whose components function as servants to master devices.

It is another optional, non-exclusive object of the present invention to provide master devices which may be portable transceivers.

It is, moreover, an optional, non-exclusive object of the present invention to provide dual user interfaces, one present at the control box and the other present on the portable device.

It is a further optional, non-exclusive object of the present invention to provide wireless radios, Ethernet capabilities, and main logic residing on the master devices.

Other objects, features, and advantages of the present invention will be apparent to those skilled in the relevant art with reference to the remaining text and drawings of this application.

DETAILED DESCRIPTION

Figure 1:
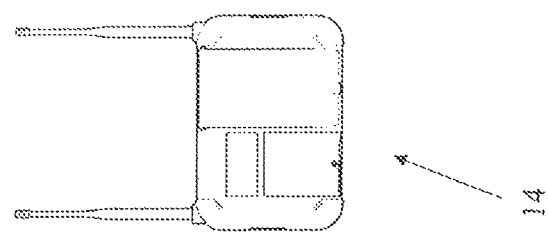
FIG. 1 schematically illustrates a control box and portable device consistent with the present invention.
Figure 1:
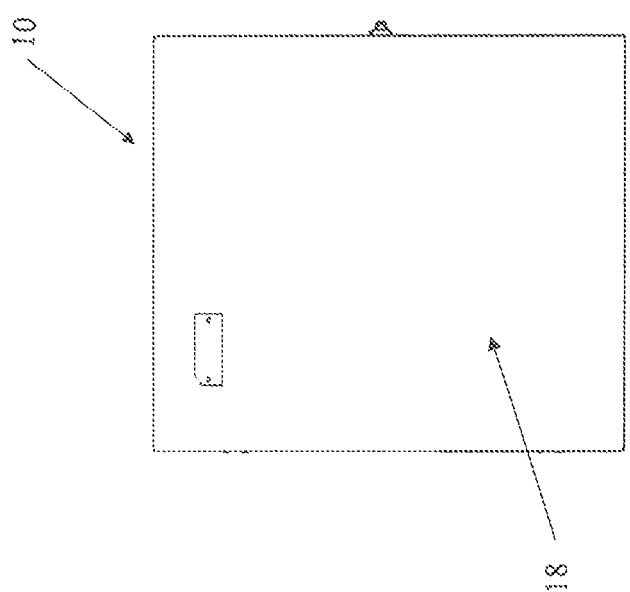

FIG. 1 illustrates an exemplary control box 10 and portable device 14 of the present invention. Portable device 14 is identified as the master device, whereas control box 10 (and its incorporated components) may function as slave, or servant, to device 14. Portable device 14 preferably is configured to transmit and receive information wirelessly. In addition to a wireless radio, portable device 14 also may, if desired, incorporate Ethernet capabilities and main logic.

Figure 2:
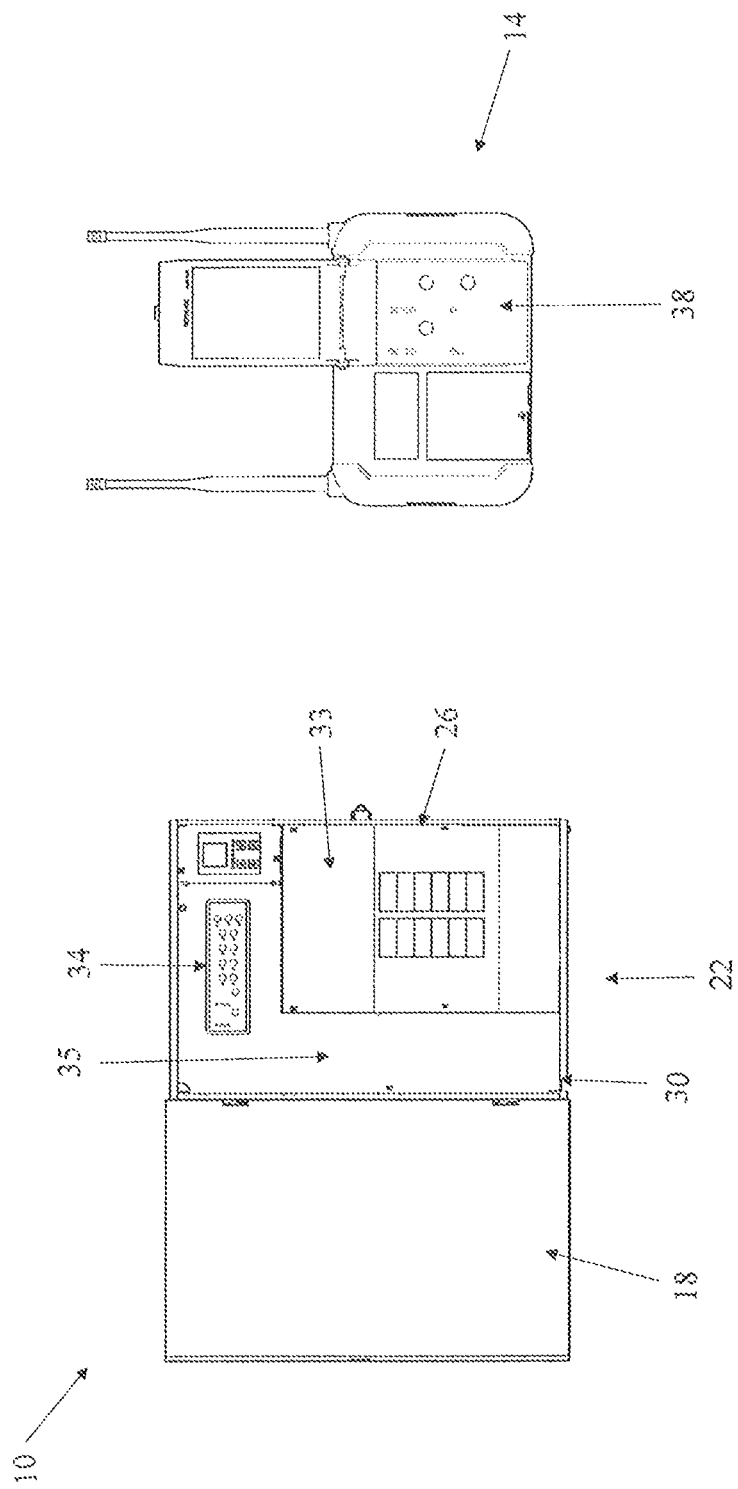
FIGS. 2-3 schematically illustrate certain internal portions of the control box and portable device of FIG. 1.
Figure 3:
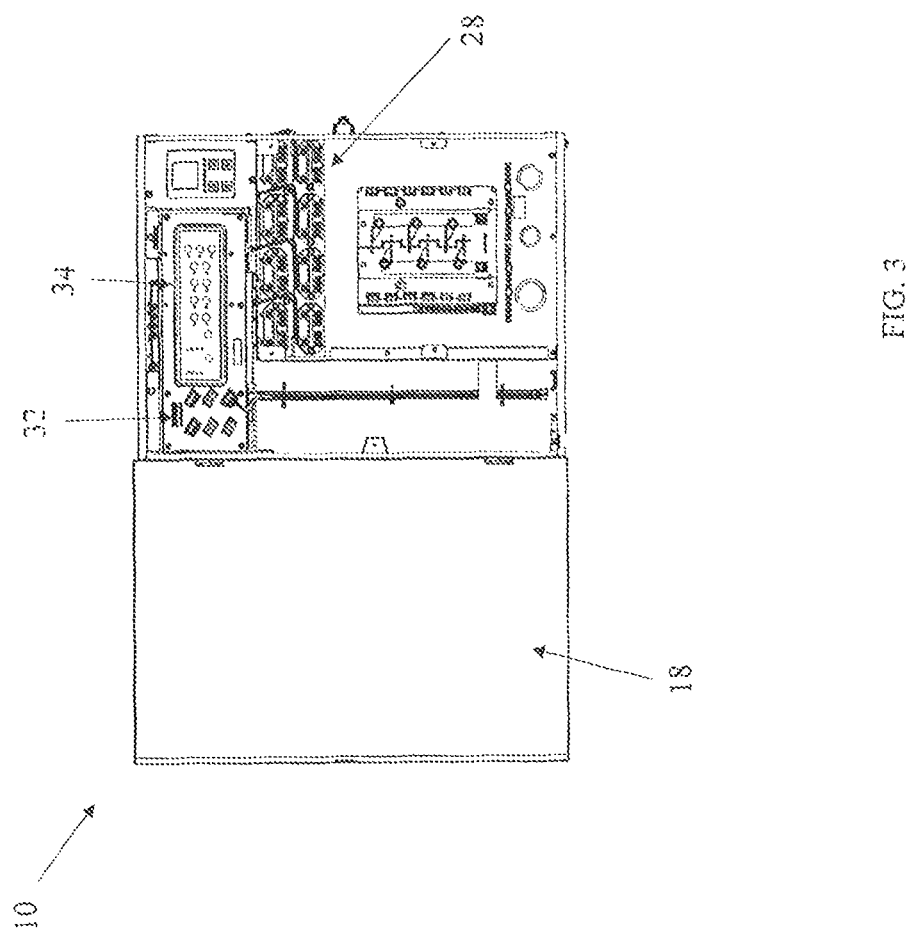

FIG. 2 generally depicts control box 10 with a door 18 thereof open so as to expose interior region 22. Interior region 22 may be divided into sub-panels, including high-voltage sub-panel assembly 26 (containing, e.g., electric relays 28 (FIG. 3)) and low-voltage sub-panel assembly 30 (containing, e.g., solid-state electronics 32 (FIG. 3)). Although sub-panel assemblies 26 and 30 may be configured in any appropriate way, preferably they have independent first and second closure devices (e.g. respective removable first and second panels 33 and 35) so that one sub-panel assembly 26 or 30 may be accessed without accessing the other sub-panel assembly 30 or 26. Interior region 22 may include at least one user interface 34, typically as part of the low-voltage sub-panel assembly. Another user interface 38, as noted above, may exist as part of portable device 14.

The foregoing is provided for purposes of illustrating, explaining, and describing embodiments of the present invention. Modifications and adaptations to these embodiments will be apparent to those skilled in the art and may be made without departing from the scope or spirit of the invention. As an example of contemplated modifications, device 14 need not necessarily be portable, even though it is intended to be separate from control box 10. Device 14 further may be configured to access the Internet and receive and transmit information via the Internet.

What is claimed is:

1. A control device configured to control, equipment of a swimming pool or spa, comprising:
    a. a first sub-panel assembly containing high-voltage components;
    b. a second sub-panel assembly containing low-voltage components;
    c. a first closure device for accessing the first sub-panel assembly without accessing the second sub-panel assembly;
    d. a second closure device for accessing the second sub-panel assembly without; accessing the first sub-panel assembly; and
    e. a solid door configured: i) in a first closed position, to cover an interior region including the first sub-panel assembly, the second sub-panel assembly, the first closure device, and the second closure device; and (ii) in a second open position, to expose the interior region.

2. A control device according to claim 1 further comprising a first user interface.

3. A control device according to claim 1 further comprising equipment for receiving and processing information transmitted from a master device.

4. A system for controlling equipment of a swimming pool or spa, comprising:
    a. a portable device configured to transmit and receive information wirelessly; and
    b. a control box comprising:
        i. a first sub-panel assembly containing high-voltage components;
        ii. a second sub-panel assembly containing low-voltage components;
        iii. a first closure device for accessing the first sub-panel assembly without accessing the second sub-panel assembly;
        iv. a second closure device for accessing the second sub-panel assembly without accessing the first sub-panel assembly;
        v. a solid door configured: (A) in a first closed position, to cover an interior region including the first sub-panel assembly, the second sub-panel assembly, the first closure device, and the second closure device; and (B) in a second open position, to expose the interior region;
        vi. equipment for receiving and processing information transmitted from the portable device; and
        vii. wiring electrically connecting at least one of the high-voltage components of the low-voltage components directly or indirectly with the equipment of the swimming pool or spa.

* * * * *